(12) United States Patent
Huang

(10) Patent No.: US 7,463,102 B2
(45) Date of Patent: Dec. 9, 2008

(54) CLOCK SYNTHESIZER WITH CLOCK DIVIDER OUTSIDE FEEDBACK LOOP AND METHOD THEREOF

(75) Inventor: Cheng-Yen Huang, Hsin-Chu (TW)

(73) Assignee: Faraday Technology Corp., Hsin-Chu (TW)

( * ) Notice: Subject to any disclaimer, the term of this patent is extended or adjusted under 35 U.S.C. 154(b) by 151 days.

(21) Appl. No.: 11/538,804

(22) Filed: Oct. 4, 2006

(65) Prior Publication Data

US 2008/0094146 A1    Apr. 24, 2008

(51) Int. Cl.
*H03B 1/00*    (2006.01)
(52) U.S. Cl. .......................... 331/74; 331/25; 327/156; 375/376
(58) Field of Classification Search ................. 331/1 A, 331/25, 74; 327/156; 375/376
See application file for complete search history.

(56) References Cited

U.S. PATENT DOCUMENTS 5,811,998 A * 9/1998 Lundberg et al. ........... 327/156

* cited by examiner

*Primary Examiner*—Arnold Kinkead
(74) *Attorney, Agent, or Firm*—Winston Hsu

(57) ABSTRACT

A de-skew multiplier clock synthesizer with a clock divider outside the feedback loop of a PLL is provided. The clock synthesizer includes a phase locked loop (PLL), a clock divider, and a phase comparator. The PLL receives a reference clock and generates a PLL output clock. The clock divider receives the PLL output clock and generates a first output clock. The phase comparator receives the reference clock, the PLL output clock, and the first output clock and generates a phase difference signal. The clock divider adjusts the first output clock to be in phase with the reference clock according to the phase difference signal.

23 Claims, 6 Drawing Sheets

CLOCK SYNTHESIZER WITH CLOCK DIVIDER OUTSIDE FEEDBACK LOOP AND METHOD THEREOF

BACKGROUND OF THE INVENTION

1. Field of the Invention

The invention relates to a clock synthesizer, and more particularly, to a de-skew multiplier clock synthesizer with the clock divider outside the feedback loop of a PLL and a method for generating an in-phase clock utilizing the clock synthesizer.

2. Description of the Prior Art

In data transmission systems, the transmitter and the receiver must be synchronized to accurately access transmitted data. Phase locked loop (PLL) circuits have been used for many years to achieve such synchronization. A typical PLL circuit receives an accurate reference input signal and performs a feedback control operation to lock the output signal in phase with the incoming reference signal. Essentially, an analog PLL circuit continuously tests the output of a voltage-controlled oscillator (VCO) through a feedback loop, and when the output of the VCO drifts away from the incoming reference signal, an error voltage is generated to pull the VCO back into synchronization with the incoming reference signal. PLL circuits thus have been widely used in a variety of applications such as communication systems, computers networks, television transmissions, etc.

Please refer to FIG. 1. FIG. 1 shows a clock synthesizer according to the prior art. The clock synthesizer includes a PLL 18 and a clock divider 16. The PLL 18 includes three main components: a phase detector (PD) 14, a loop filter 12, and a voltage controlled oscillator (VCO) 10. The clock divider 16 adjusts the frequency of the VCO 10 output signal $f_{out}$ to correspond to the frequency of an incoming reference signal. The PD 14 compares an incoming reference signal $f_{ref}$ and the fed-back output of VCO 10 $f_{out}/N$, and generates an error signal which represents any phase differences between the reference signal $f_{ref}$ and the VCO 10 output. The loop filter 12 acts as a low-pass filter, thereby removing alternating current (ac) components to provide a direct-current (dc) voltage signal to drive the VCO 10. This input voltage supplied from the loop filter 12 controls the output frequency of the VCO 10. The output $f_{out}$ of the VCO 10 is fed-back to the PD 14 through the clock divider 16 and is continuously driven in a direction that will minimize the error signal generated by the PD 14. Once the signals $f_{ref}$ and $f_{out}/N$ are made equal, the output of VCO 10 is said to be locked to the input reference signal, and any phase differences between the two signals will be controlled.

The most important characteristic of the clock synthesizer according to the prior art should be that the clock divider must be in the feedback loop of the PLL, and it's benefit to physically simple, straightforward and low cost. However, let the clock divider be used inside the PLL feedback loop so that the initiation of the clock divider should be nothing about the de-skew requirement since the PLL would carry out the de-skew mechanism due to the physical attribute of the PLL. So there is potential PLL malfunction due to the VOC performance without the detail of the clock divider outside the PLL. The difficulty for the simulation and verification is another problem since the feedback loop is improper and hard to be simulated and verified. The design of de-skew multiplier clock synthesizers with the clock divider in the feedback loop should be hard to be maintained and migrated, and need more effort to go through the details.

SUMMARY OF THE INVENTION

The claimed invention provides a clock synthesizer including a phase locked loop (PLL) having a reference end and a clock-out end; a clock divider having an input end coupled to the clock-out end of the PLL, an output end, and a control end; and a phase comparator having a first input end coupled to the output end of the clock divider, a second input end coupled to the clock-out end of the PLL, a third input end coupled to the reference end of the PLL, and a transmission end coupled to the control end of the clock divider.

The claimed invention provides a method for generating an in phase clock including inputting a reference clock to a phase locked loop (PLL) to generate a PLL output clock; inputting the PLL output clock to a clock divider; the clock divider generating a first output clock; inputting the reference clock, the PLL output clock, and the first output clock to a phase comparator to generate a phase difference signal; and the clock divider adjusting the first output clock to be in phase with the reference clock according to the phase difference signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
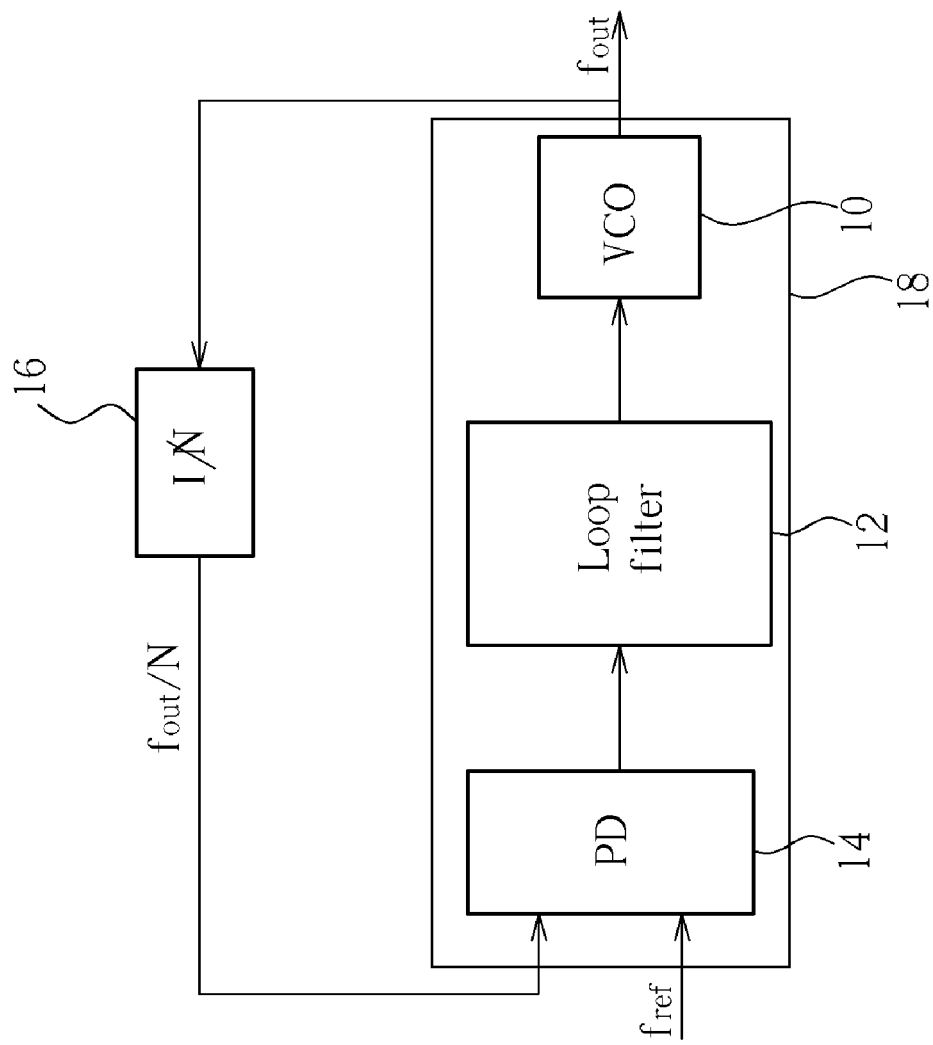
FIG. 1 shows a clock synthesizer according to the prior art.
Figure 2:
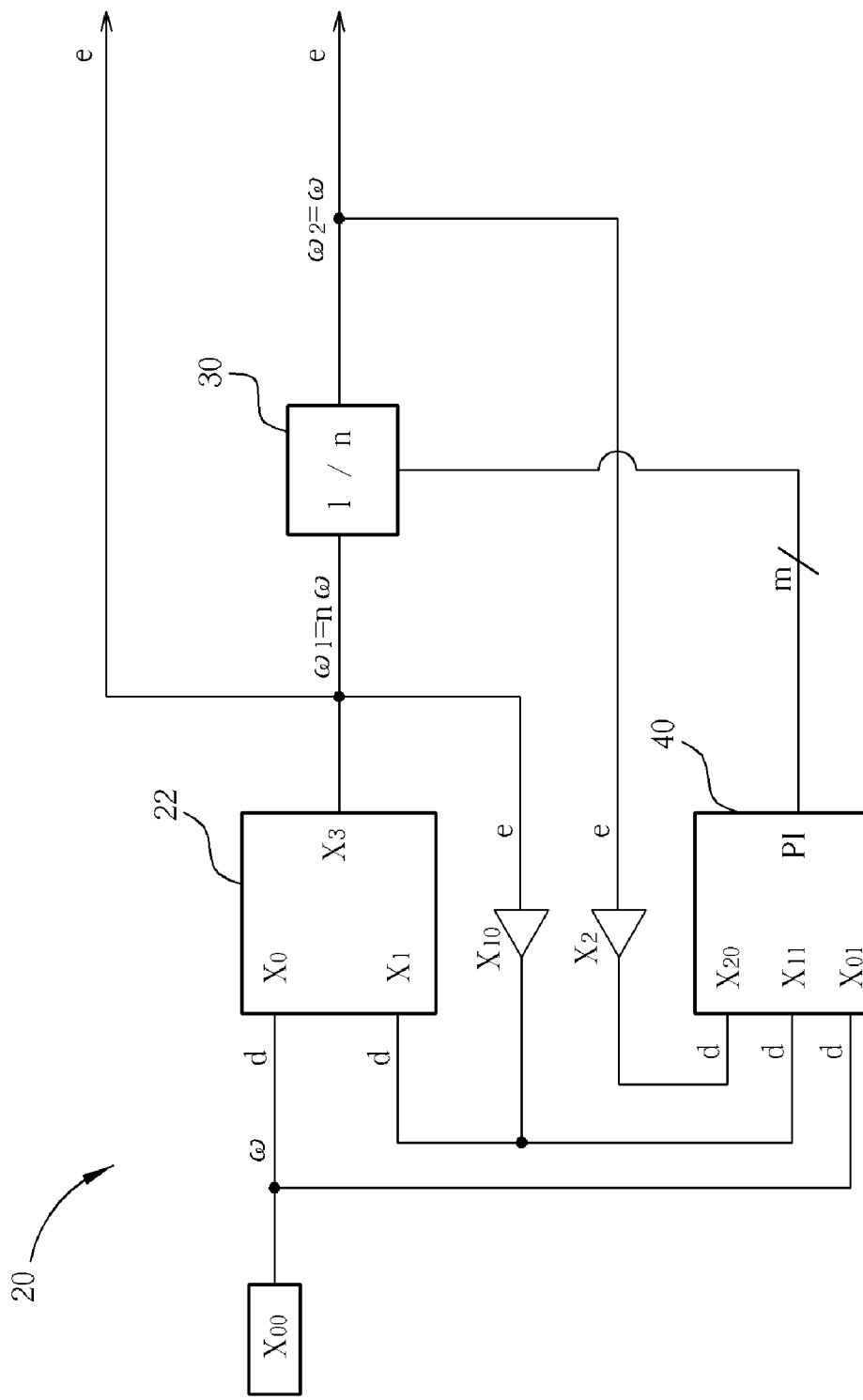
FIG. 2 shows a schematic block diagram of a clock synthesizer according to the present invention.

The present invention providing a de-skew multiplier clock synthesizer can be exemplified by the exemplary embodiment and the accompanied drawings as described hereinafter. Please refer to FIG. 2. FIG. 2 shows a schematic block diagram of a clock synthesizer 20 according to the present invention. The clock synthesizer 20 includes a phase locked loop (PLL) 22, a clock divider 30, a phase comparator 40, a first buffer ($x_{10}$), and a second buffer ($x_2$). The PLL 22 has a reference end ($x_0$), a clock-in end ($x_1$) end, and a clock-out end ($x_3$). The PLL 22 receives a reference clock via the reference end ($x_0$) and generates a PLL output clock via the clock-out end ($x_3$). The PLL output clock is transmitted to the clock-in end ($x_1$) via the feedback loop of the PLL. The clock divider 30 has an input end receiving the PLL output clock, an output end generating a first clock, and a control end. The phase comparator 40 has first, second, and third input ends ($x_{20}, x_{11}, x_{01}$) and a transmission end (PI). The reference clock is transmitted to the third input end ($x_{01}$). The PLL output clock is transmitted to the second input end ($x_{11}$) via the first buffer ($x_{10}$). The first output clock is transmitted to the first input end ($x_{20}$) via the second buffer ($x_2$). After receiving the three clocks respectively, the phase comparator 40 generates a phase difference signal from the transmission end (PI) to the control end of the clock divider 30. According to the phase difference signal, the clock divider 30 can adjust the first output clock to be in phase with the reference clock.

The detail analysis about the clock synthesizer 20 according to the present invention in FIG. 2 is as following.

Step 0:

Let the clock be used as $$\text{SIN}(\kappa x + \omega t) = \begin{cases} V, & \text{if } \sin(\kappa x + \omega t) \geq 0 \\ 0, & \text{if } \sin(\kappa x + \omega t) < 0 \end{cases},$$

where V should be the amplitude of the clock.

Step 1:

A. for the points $x_1$ and $x_0$ in the boundary of PLL, $$\text{SIN}(\kappa x_0 + \omega t) = \text{SIN}\left(\kappa x_1 + \frac{\omega_1}{n} t\right)$$

B. for the points $x_{00}$ and $x_{10}$, the following will be true by item A, due to clock tree synthesis (CTS) and the principle of the PLL.

$$\text{SIN}(\kappa x_0 + \omega t) = \text{SIN}\left(\kappa x_1 + \frac{\omega_1}{n} t\right)$$

$$\text{SIN}(\kappa(x_{00} + d) + \omega t) = \text{SIN}\left(\kappa(x_{10} + d) + \frac{\omega_1}{n} t\right),$$

since $x_{00}$ and $x_{10}$ both are leading distance d from $x_0$ and $x_1$ respectively.

$$\text{SIN}(\kappa x_{00} + \omega t + \kappa d) = \text{SIN}\left(\kappa x_{10} + \frac{\omega_1}{n} t + \kappa d\right)$$

$$\therefore \text{SIN}(\kappa x_{00} + \omega t) = \text{SIN}\left(k x_{10} + \frac{\omega_1}{n} t\right)$$

Step 2:

A. for the point $x_{10}$ with respect to the point $x_3$, $$\text{SIN}\left(\kappa x_{10} + \frac{\omega_1}{n} t\right) = \text{SIN}\left(\kappa(x_3 + e) + \frac{\omega_1}{n} t\right)$$

$$\text{SIN}\left(\kappa x_{10} + \frac{\omega_1}{n} t\right) = \text{SIN}\left(\kappa x_3 + \frac{\omega_1}{n} t + \kappa e\right)$$

B. for the points $x_2$ with respect to the point $x_3$, $$\text{SIN}(\kappa x_2 + \omega_2 t) = \text{SIN}\left(\kappa(x_3 + e) + \frac{\omega_1}{n}(t + t_0)\right)$$

since the 1/n clock divider from $\omega_1$ to $\omega_2$ is introduced in the route, from $x_3$ to $x_2$, and t0 is the initial condition of the clock divider $$\text{SIN}(\kappa x_2 + \omega t) = \text{SIN}\left(\kappa x_3 + \frac{\omega_1}{n} t + \kappa e + \frac{\omega_1}{n} t_0\right), \text{ since } \omega_2 = \omega$$

$$\text{SIN}(\kappa x_2 + \omega t) = \text{SIN}\left(\kappa x_3 + \frac{\omega_1}{n} t + \kappa e + 2\pi \times \frac{m}{n}\right),$$

where $m \in \{0, 1, 2, \ldots, n-1\}$ $$\text{SIN}\left(\kappa x_2 + \omega t + 2\pi \times \left(1 - \frac{m}{n}\right)\right) =$$

$$\text{SIN}\left(\kappa x_3 + \frac{\omega_1}{n} t + \kappa e + 2\pi \times \frac{m}{n} + 2\pi \times \left(1 - \frac{m}{n}\right)\right),$$

where $m \in \{0, 1, 2, \ldots, n-1\}$ or $$\text{SIN}\left(\kappa x_2 + \omega t - 2\pi \times \frac{m}{n}\right) = \text{SIN}\left(\kappa x_3 + \frac{\omega_1}{n} t + \kappa e + 2\pi \times \frac{m}{n} - 2\pi \times \frac{m}{n}\right),$$

where $m \in \{0, 1, 2, \ldots, n-1\}$ $$\text{SIN}\left(\kappa x_2 + \omega t - 2\pi \times \left(1 - \frac{m}{n}\right)\right) = \text{SIN}\left(\kappa x_3 + \frac{\omega_1}{n} t + \kappa e + 2\pi\right),$$

where $m \in \{0, 1, 2, \ldots, n-1\}$ or $$\text{SIN}\left(\kappa x_2 + \omega t - 2\pi \times \frac{m}{n}\right) = \text{SIN}\left(\kappa x_3 + \frac{\omega_1}{n} t + \kappa e\right),$$

where $m \in \{0, 1, 2, \ldots, n-1\}$ $$\therefore \text{SIN}\left(\kappa x_2 + \omega t + 2\pi \times \left(1 - \frac{m}{n}\right)\right) =$$

$$\text{SIN}\left(\kappa x_2 + \omega t - 2\pi \times \frac{m}{n}\right) = \text{SIN}\left(\kappa x_3 + \frac{\omega_1}{n} t + \kappa e\right),$$

where $m \in \{0, 1, 2, \ldots, n-1\}$

C. for above items, $$\text{SIN}\left(\kappa x_2 + \omega t + 2\pi \times \left(1 - \frac{m}{n}\right)\right) = \text{SIN}\left(\kappa x_2 + \omega t - 2\pi \times \frac{m}{n}\right)$$

$$= \text{SIN}\left(\kappa x_3 + \frac{\omega_1}{n} t + \kappa e\right),$$

where $m \in \{0, 1, 2, \ldots, n-1\}$ $$\therefore \text{SIN}\left(\kappa x_2 + \omega t + 2\pi \times \left(1 - \frac{m}{n}\right)\right) = \text{SIN}\left(\kappa x_2 + \omega t - 2\pi \times \frac{m}{n}\right)$$

$$= \text{SIN}\left(\kappa x_{10} + \frac{\omega_1}{n} t\right),$$

where $m \in \{0, 1, 2, \ldots, n-1\}$

Step 3:

The above results should be summarized as the following.

In step 1.B $$\text{SIN}(\kappa x_{00} + \omega t) = \text{SIN}\left(\kappa x_{10} + \frac{\omega_1}{n} t\right)$$

In step 2.C $$\text{SIN}\left(\kappa x_2 + \omega t + 2\pi \times \left(1 - \frac{m}{n}\right)\right) = \text{SIN}\left(\kappa x_2 + \omega t - 2\pi \times \frac{m}{n}\right)$$

$$= \text{SIN}\left(\kappa x_{10} + \frac{\omega_1}{n} t\right),$$

where $m \in \{0, 1, 2, \ldots, n-1\}$ $$SIN(\kappa x_{00} + \omega t) = SIN\left(\kappa x_{10} + \frac{\omega_1}{n}t\right)$$
$$= SIN\left(\kappa x_2 + \omega t + 2\pi \times \left(1 - \frac{m}{n}\right)\right)$$
$$= SIN\left(\kappa x_2 + \omega t - 2\pi \times \frac{m}{n}\right),$$

where $m \in \{0,1,2,\ldots,n-1\}$

Step 4:

For the points $x_{01}$, $x_{11}$ and $x_{20}$ with respect to the points $x_{00}$, $x_{10}$ and $x_2$ respectively, $$SIN(\kappa x_{01} + \omega t) = SIN(\kappa(x_{00} + d) + \omega t)$$
$$= SIN(\kappa x_{00} + \omega t + \kappa d)$$
$$= SIN\left(\kappa x_{10} + \frac{\omega_1}{n}t + \kappa d\right)$$
$$= SIN\left(\kappa(x_{10} + d) + \frac{\omega_1}{n}t\right)$$
$$= SIN\left(\kappa x_{11} + \frac{\omega_1}{n}t\right)$$

$$SIN\left(\kappa x_{20} + \omega t + 2\pi \times \left(1 - \frac{m}{n}\right)\right) \text{ or}$$
$$SIN\left(\kappa x_{20} + \omega t - 2\pi \times \frac{m}{n}\right) = SIN\left(\kappa(x_2 + d) + \omega t + 2\pi \times \left(1 - \frac{m}{n}\right)\right) \text{ or}$$

$$SIN\left(\kappa(x_2 + d) + \omega t - 2\pi \times \frac{m}{n}\right)$$
$$= SIN\left(\kappa x_{10} + \frac{\omega_1}{n}t + \kappa d\right)$$
$$= SIN\left(\kappa(x_{10} + d) + \frac{\omega_1}{n}t\right)$$
$$= SIN\left(\kappa x_{11} + \frac{\omega_1}{n}t\right)$$

$$SIN(kx_{01} + \omega t) = SIN\left(\kappa x_{20} + \omega t + 2\pi \times \left(1 - \frac{m}{n}\right)\right)$$
$$= SIN\left(\kappa x_{20} + \omega t - 2\pi \times \frac{m}{n}\right)$$
$$= SIN\left(\kappa x_{11} + \frac{\omega}{n}t\right)$$

The above equation means the phase difference between $x_{00}$ and $x_2$ with its equivalence, which might be introduced by the clock divider 30, can be measured in the phase comparator 40 and the phase comparator 40 can provide the clock divider 30 the phase-difference information $$\left(+2\pi \times \frac{m}{n}\right)$$

in the background so that the clock divider 30 can easily compensate for the improper initial condition by $$-2\pi \times \frac{m}{n}$$
or
$$+2\pi \times \left(1 - \frac{m}{n}\right).$$

Figure 3:
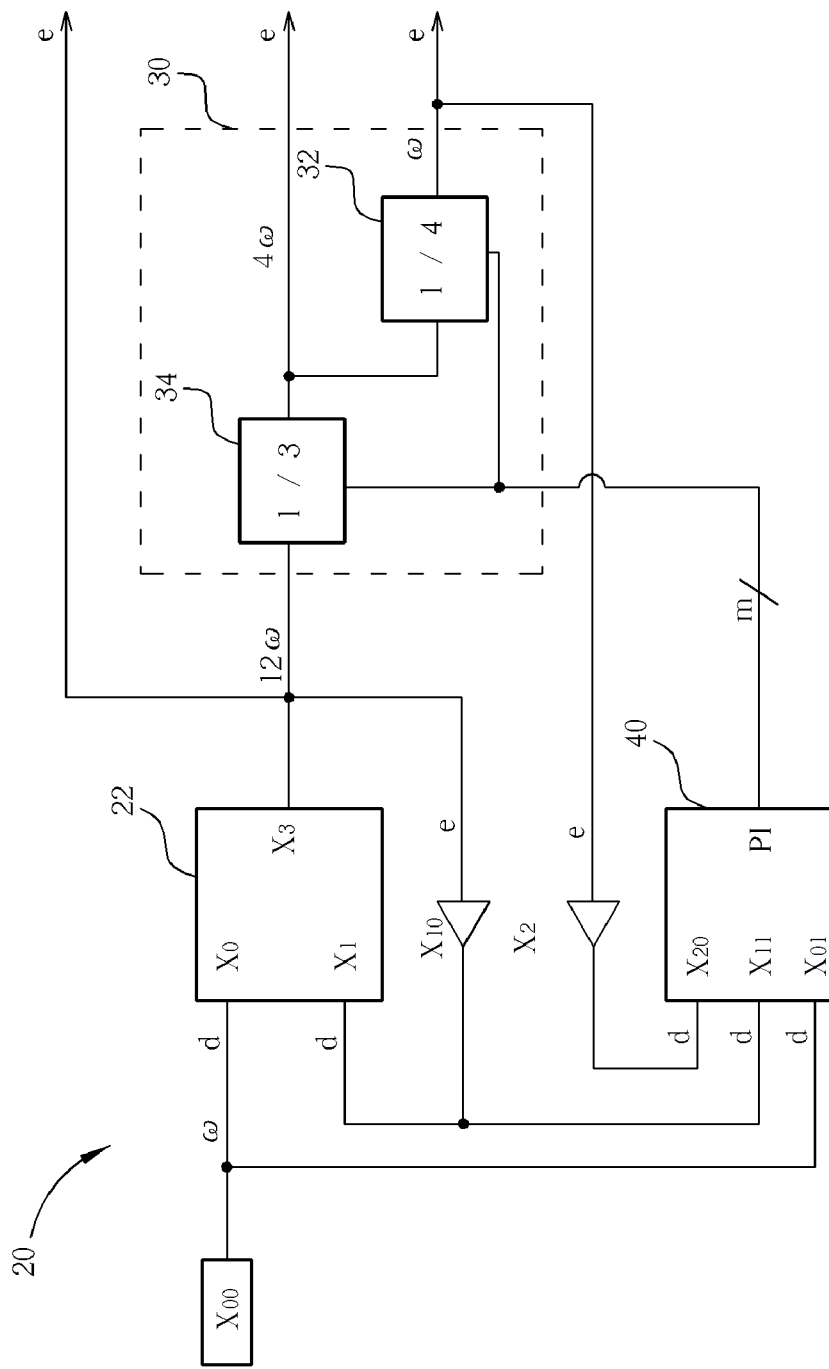
FIG. 3 shows a schematic block diagram of the clock divider with two dividing circuits according to the present invention.

Please refer to FIG. 3. FIG. 3 shows a schematic block diagram of the clock divider 30 with two dividing circuits according to the present invention. In this embodiment, the clock divider 30 includes the first clock dividing circuit 32 generating a first output clock and the second clock dividing circuit 34 generating a second output clock. The factor of the first clock dividing circuit 32 and the second clock dividing circuit 34 are assumed to be ¼ and ⅓ respectively. The second clock dividing circuit 34 receives the PLL output clock with 12 multiplied frequency and generates the second output clock with 4 multiplied frequency, and the first clock dividing circuit 32 generates the first output clock with 1 multiplied frequency.

Figure 4:
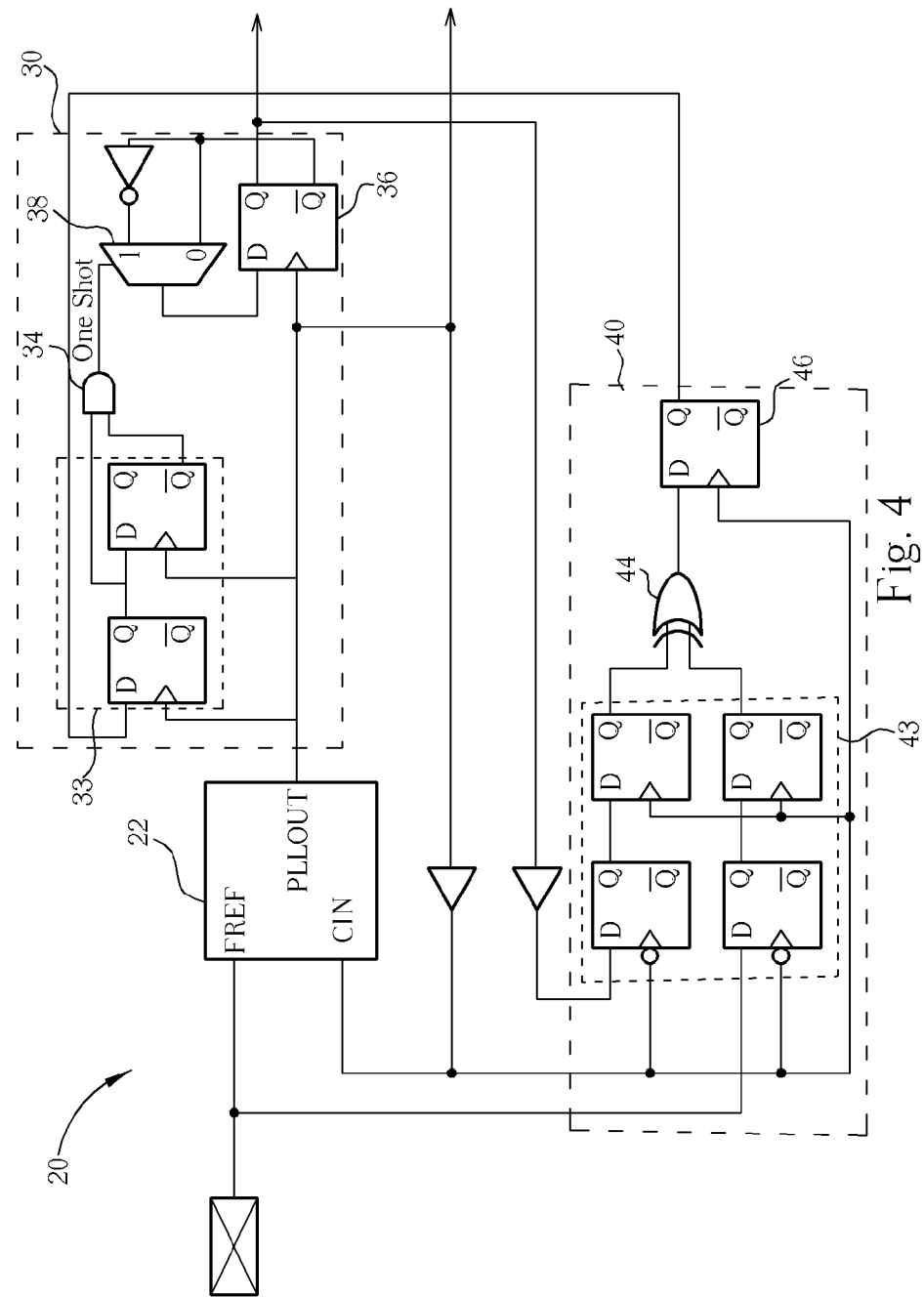
FIG. 4 shows an exemplary embodiment of the clock synthesizer according to the present invention.

Please refer to FIG. 4. FIG. 4 shows an exemplary embodiment of a clock synthesizer 20 according to the present invention. FREF, CIN, and PLLOUT denote the reference end, the clock-in end, and the PLL output end of the PLL 22 respectively. The clock divider 30 includes a plurality of first registers 33, an AND gate 34, a second register 36, and a selector 38. The plurality of first registers 33 receives the PLL output clock and the phase difference signal. The AND gate 34 receives the data of the plurality of first registers 33 and generates a one-shot signal (OneShot). The second register 36 generates the first output clock according to the one-shot signal (OneShot). The phase comparator 40 includes a plurality of third registers 43, an exclusive OR gate 44, and a fourth register 46. The plurality of third registers 43 receives the reference clock, the PLL output clock, and the first output clock. The exclusive OR gate 44 receives the data of the plurality of third registers 43 and generates a phase signal. The fourth register 46 generates the phase difference signal according to the phase signal and the PLL output clock.

Figure 5:
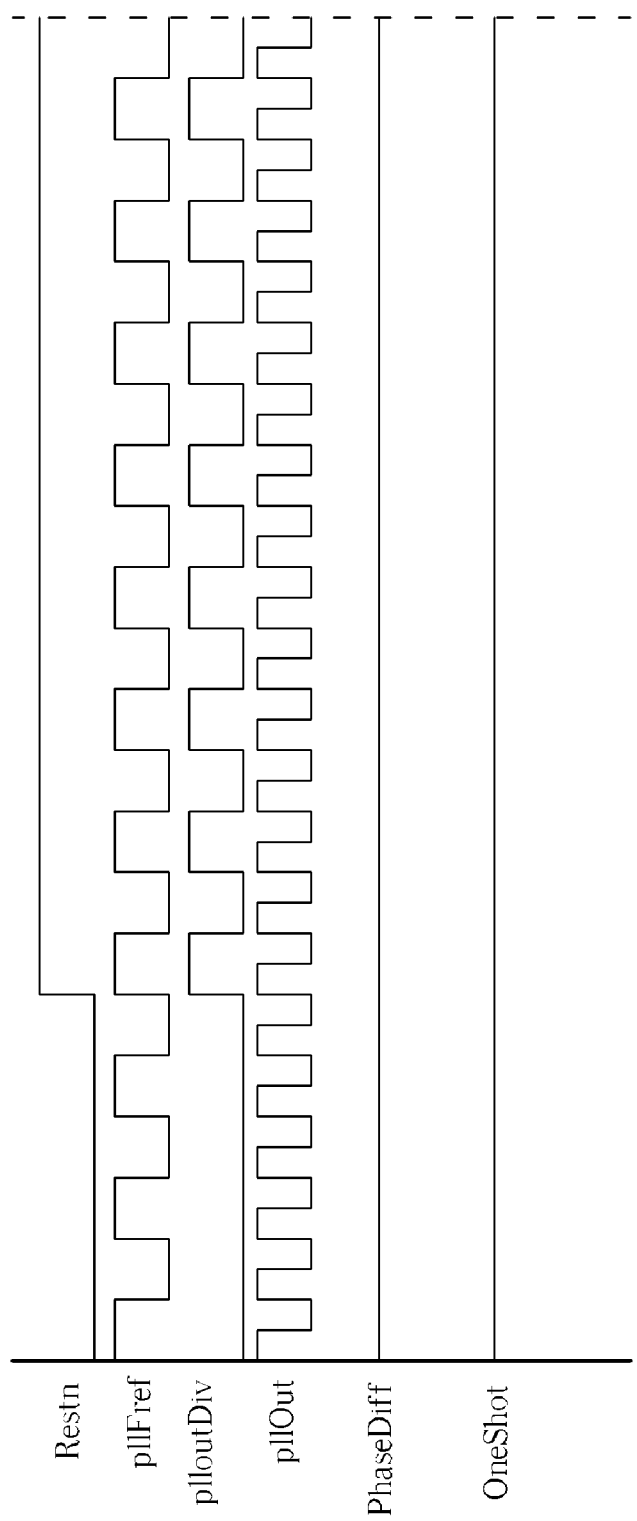
FIG. 5 shows waveforms for the clock synthesizer with matched initiation.
Figure 6:
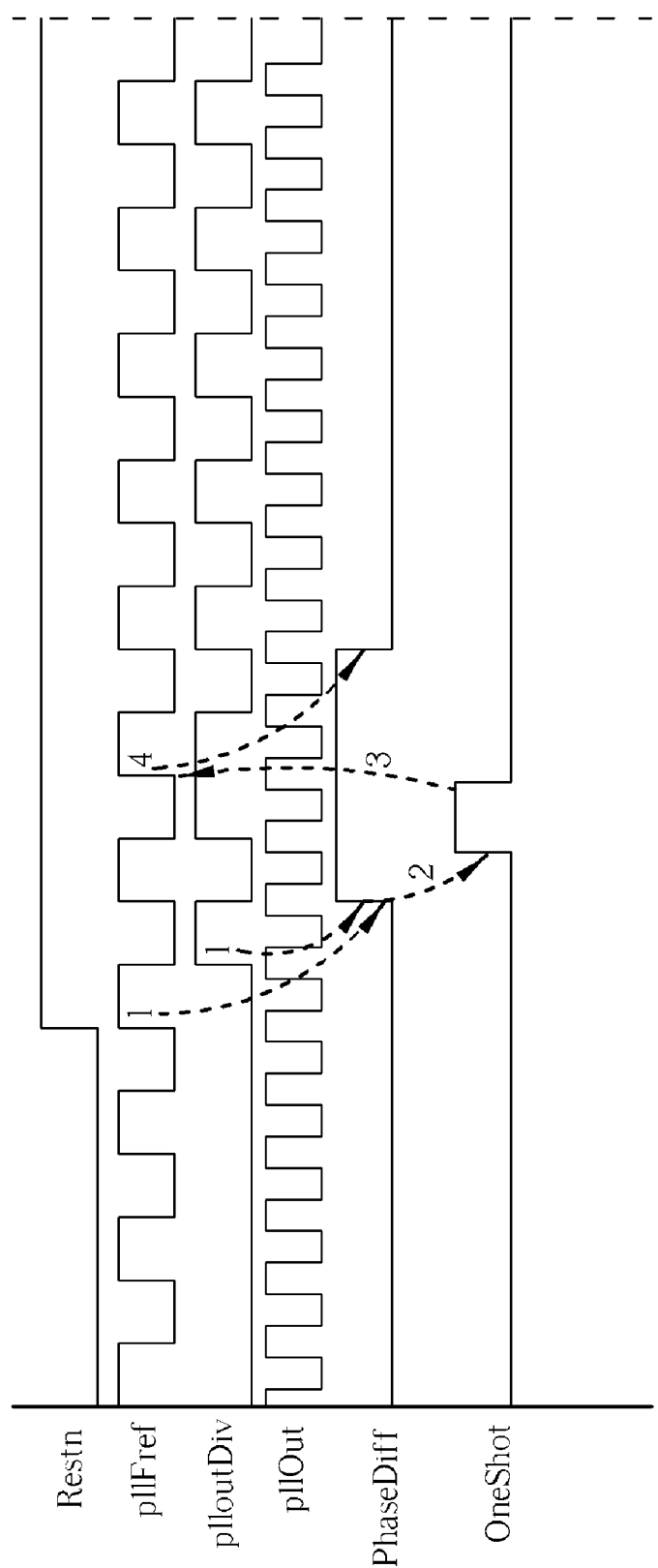
FIG. 6 shows waveforms for the clock synthesizer with mismatched initiation.

Please refer to FIG. 5 and FIG. 6. FIG. 5 shows waveforms for the clock synthesizer 20 with matched initiation. FIG. 6 shows waveforms for the clock synthesizer 20 with mismatched initiation. Restn denotes a reset signal for initiation. pllFref, plloutDiv, pllOut, PhaseDiff, and OneShot denote the reference clock, the first output clock, the PLL output clock, the phase difference signal, and the one-shot signal respectively. As shown in FIG. 5, the first output clock (plloutDiv) is in phase with the reference clock (pllFref) at initiation, so the phase difference signal (phaseDiff) and the one-shot signal (OneShot) keep constant. While the first output clock (plloutDiv) is mismatched to the reference clock (pllFref) at initiation, the phase comparator 40 raises the phase difference signal (phasediff) and the clock divider 30 raises the one-shot signal (OneShot) as indicators 1-4 illustrate in FIG. 6. The first output clock (plloutDiv) is held to synchronize with the reference clock (pllFref) according to the one-shot signal (OneShot). Therefore, the first output clock (plloutDiv) is in phase with the reference clock (pllFref).

As above-mentioned, the clock synthesizer according to the present invention realizes the same functionality as de-skew multiplier clock synthesizers with the clock divider in the feedback loop, and is also introduced as the low-cost simple straightforward solution in the system. The clock synthesizer according to the present invention respective operating requirement is introduced for de-skew speed and a high performance solution easier than the prior art for the simulation, verification, and so on. The clock divider, by an asynchronous or synchronous way, can adjust the output of the clock divider such that the input clock of the PLL and the output clock of the clock divider can be in phase at the wanted locations. Because the clock divider is outside the feedback loop of the PLL, the clock synthesizer according to the present invention is capable to be migrated into a new manufacturing process easily and be migrated with the conventional PLL easily. That is, the clock synthesizer according to the present invention is applicable to any system, where de-skew multiplier clock synthesizers are used.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock synthesizer comprising:
   a phase locked loop (PLL) having a reference end and a clock-out end;
   a clock divider having an input end coupled to the clock-out end of the PLL, an output end, and a control end;
   a phase comparator having a first input end coupled to the output end of the clock divider, a second input end coupled to the clock-out end of the PLL, a third input end coupled to the reference end of the PLL, and a transmission end coupled to the control end of the clock divider; and
   a first buffer coupled between the output end of the clock divider and the first input end of the phase comparator.

2. The clock synthesizer of claim 1 further comprising a second_buffer coupled between the clock-out end of the PLL and the second input end of the phase comparator.

3. The clock synthesizer of claim 1, wherein the clock divider comprises a first dividing circuit coupled to the first input end of the phase comparator for generating a first output clock, and a second dividing circuit for generating a second output clock, the second dividing circuit coupled between the clock-out end of the PLL and the first dividing circuit.

4. The clock synthesizer of claim 3, wherein the first and second dividing circuits each comprise a control end coupled to the transmission end of the phase comparator.

5. The clock synthesizer of claim 1, wherein the PLL further comprises a clock-in end coupled to the clock-out end.

6. The clock synthesizer of claim 1, wherein the clock divider comprises:
   a plurality of first registers coupled to the input and control ends of the clock divider;
   an AND gate coupled to the plurality of first registers;
   a selector coupled to the AND gate; and
   a second register coupled to the input and output ends of the clock divider, and to the selector.

7. The clock synthesizer of claim 1, wherein the phase comparator comprises:
   a plurality of third registers coupled to the first, the second, and the third input ends of the phase comparator;
   an exclusive OR gate coupled to the plurality of third registers; and
   a fourth register coupled to the second input and transmission ends of the phase comparator, and to the exclusive OR gate.

8. A method for generating an in phase clock comprising:
   inputting a reference clock to a phase locked loop (PLL) to generate a PLL output clock;
   inputting the PLL output clock to a clock divider;
   the clock divider generating a first output clock and a second output clock, and the first output clock being generated according to the second output clock;
   inputting the reference clock, the PLL output clock, and the first output clock to a phase comparator to generate a phase difference signal; and
   the clock divider adjusting the first output clock to be in phase with the reference clock according to the phase difference signal.

9. The method of claim 8 further comprising:
   inputting the PLL output clock to the PLL through the feedback loop of the PLL.

10. The method of claim 8, wherein the clock divider adjusting the first output clock to be in phase with the reference clock according to the phase difference signal is the clock divider generating a one-shot signal according to the phase difference signal to shift the first output clock to be in phase with the reference clock.

11. A clock synthesizer comprising:
    a phase locked loop (PLL) having a reference end and a clock-out end;
    a clock divider having an input end coupled to the clock-out end of the PLL, an output end, and a control end; and
    a phase comparator having a first input end coupled to the output end of the clock divider, a second input end coupled to the clock-out end of the PLL, a third input end coupled to the reference end of the PLL, and a transmission end coupled to the control end of the clock divider.

12. The clock synthesizer of claim 11 further comprising a first buffer coupled between the clock-out end of the PLL and the second input end of the phase comparator.

13. The clock synthesizer of claim 11 further comprising a second buffer coupled between the output end of the clock divider and the first input end of the phase comparator.

14. The clock synthesizer of claim 11, wherein the clock divider comprises a first dividing circuit coupled to the first input end of the phase comparator for generating a first output clock, and a second dividing circuit for generating a second output clock, the second dividing circuit coupled between the clock-out end of the PLL and the first dividing circuit.

15. The clock synthesizer of claim 14, wherein the first and second dividing circuits each comprise a control end coupled to the transmission end of the phase comparator.

16. The clock synthesizer of claim 11, wherein the PLL further comprises a clock-in end coupled to the clock-out end.

17. The clock synthesizer of claim 11, wherein the clock divider comprises:
    a plurality of first registers coupled to the input and control ends of the clock divider;
    an AND gate coupled to the plurality of first registers;
    a selector coupled to the AND gate; and
    a second register coupled to the input and output ends of the clock divider, and to the selector.

18. The clock synthesizer of claim 11, wherein the phase comparator comprises:
    a plurality of third registers coupled to the first, the second, and the third input ends of the phase comparator;
    an exclusive OR gate coupled to the plurality of third registers; and
    a fourth register coupled to the second input and transmission ends of the phase comparator, and to the exclusive OR gate.

19. A method for generating an in phase clock comprising:
    inputting a reference clock to a phase locked loop (PLL) to generate a PLL output clock;
    inputting the PLL output clock to a clock divider;
    the clock divider generating a first output clock;
    inputting the reference clock, the PLL output clock, and the first output clock to a phase comparator to generate a phase difference signal; and
    the clock divider adjusting the first output clock to be in phase with the reference clock according to the phase difference signal.

20. The method of claim 19 further comprising:
the clock divider generating a second output clock.

21. The method of claim 20, wherein the clock divider generates the first output clock according to the second output clock.

22. The method of claim 19 further comprising:
inputting the PLL output clock to the PLL through the feedback loop of the PLL.

23. The method of claim 19, wherein the clock divider adjusting the first output clock to be in phase with the reference clock according to the phase difference signal is the clock divider generating a one-shot signal according to the phase difference signal to shift the first output clock to be in phase with the reference clock.

* * * * *